United States Patent
Nguyen et al.

[11] Patent Number: 5,918,150
[45] Date of Patent: Jun. 29, 1999

[54] METHOD FOR A CHEMICAL VAPOR DEPOSITION OF COPPER ON AN ION PREPARED CONDUCTIVE SURFACE

[75] Inventors: Tue Nguyen, Camas; Jer-Shen Maa, Vancouver, both of Wash.

[73] Assignees: Sharp Microelectronics Technology, Inc., Camas, Wash.; Sharp Kabushiki Kaisha, Osaka, Japan

[21] Appl. No.: 08/729,567

[22] Filed: Oct. 11, 1996

[51] Int. Cl.$^6$ .............................................. H01L 21/3065
[52] U.S. Cl. ...................... 438/687; 438/643; 438/653; 438/677; 438/639
[58] Field of Search ................... 438/643, 648, 438/653, 677, 687, 658, 639

[56] References Cited

U.S. PATENT DOCUMENTS

| | | | |
|---|---|---|---|
| 4,800,179 | 1/1989 | Mukai | 438/632 |
| 5,130,274 | 7/1992 | Harper et al. | 438/624 |
| 5,236,869 | 8/1993 | Takagi et al. | 438/635 |
| 5,554,254 | 9/1996 | Huang et al. | 438/643 |
| 5,618,619 | 4/1997 | Petrmichl et al. | 428/334 |
| 5,670,421 | 9/1997 | Nishitani et al. | 438/641 |
| 5,674,787 | 10/1997 | Zhao et al. | 438/627 |

*Primary Examiner*—Richard A. Booth
*Assistant Examiner*—Ha Tran Nguyen
*Attorney, Agent, or Firm*—Gerald Maliszewski; David Ripma

[57] ABSTRACT

A method for etching a metallic surface on an integrated circuit (IC) is provided to minimize electrical resistance between the metallic surface and subsequently applied chemical vapor deposition (CVD) copper. The metallic surface is etched with the ions of an inert gas, such as Ar, at low energy levels. A low energy level minimizes the penetration of ions into the metallic surface, and the use of an inert gas minimizes chemical interactions between the metallic surface and the ions. CVD copper is then applied to the etched surface. In one embodiment, an inert gas and oxygen ions are used to prepare the metallic surface. The inert gas ions are used to etch the metallic surface to improve conductivity, and the oxygen ions promote the formation of an oxide layer to improve adhesion between the metallic surface and the copper. An IC comprising a copper stud to interconnect dielectric interlevels with improved electrical conductivity is also provided. In one embodiment, the copper stud is interfaced to diffusion barrier material, in another embodiment the copper stud is interfaced to a metallic surface.

20 Claims, 4 Drawing Sheets

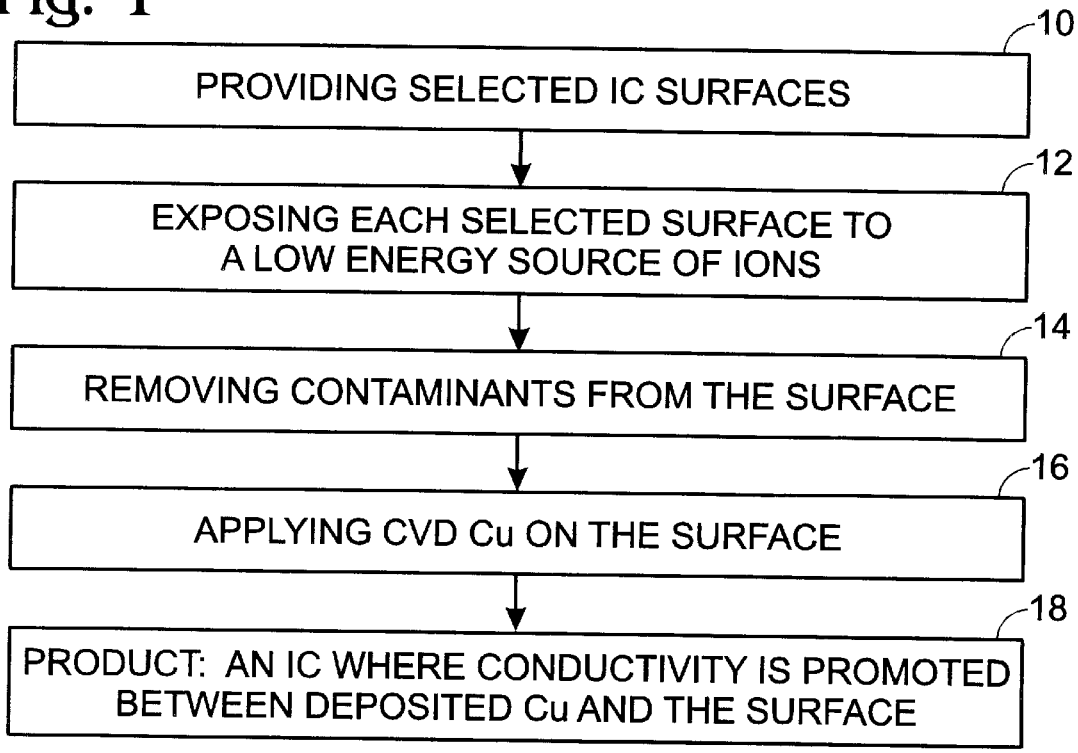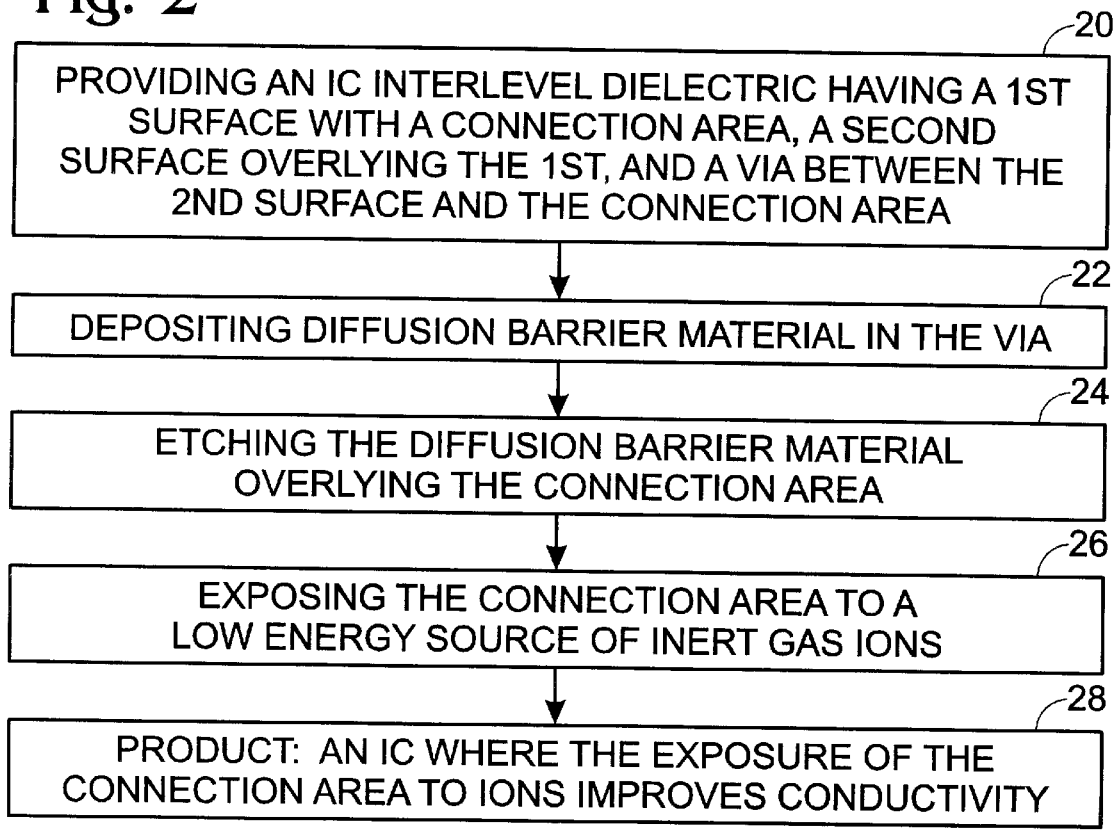

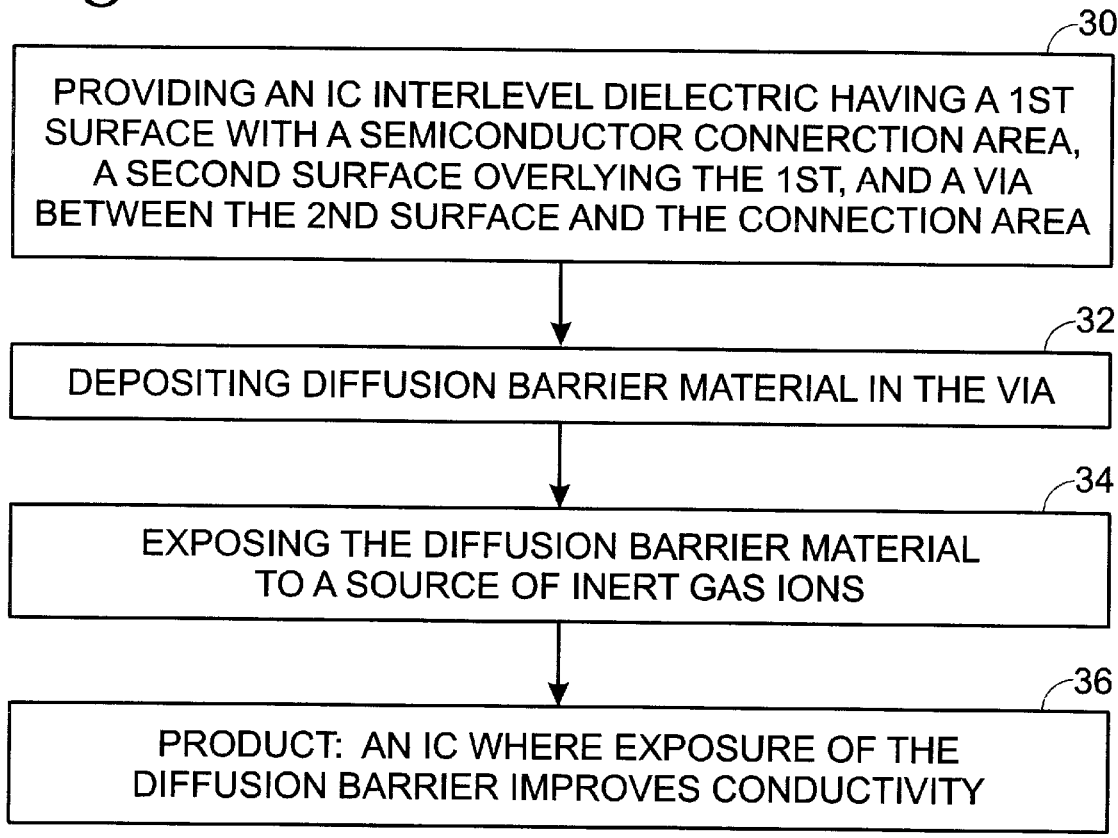

METHOD FOR A CHEMICAL VAPOR DEPOSITION OF COPPER ON AN ION PREPARED CONDUCTIVE SURFACE

BACKGROUND AND SUMMARY OF THE INVENTION

This invention relates generally to integrated circuit processes and fabrication, and more particularly, an integrated circuit and method for having improved electrical conductivity between copper and a conductive surface.

The demand for progressively smaller, less expensive, and more powerful electronic products, in turn, fuels the need for smaller geometry integrated circuits (ICs), and large substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. The conductivity of the interconnects is reduced as the surface area of the interconnect is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different impedance characteristics.

There is a need for interconnects and vias to have both low resistivity, and the ability to withstand volatile process environments. Aluminum and tungsten metals are often used in the production of integrated circuits for making interconnections or vias between electrically active areas. These metals are popular because they are easy to use in a production environment, unlike copper which requires special handling.

Copper (Cu) is a natural choice to replace aluminum in the effort to reduce the size of lines and vias in an electrical circuit. The conductivity of copper is approximately twice that of aluminum and over three times that of tungsten. As a result, the same current can be carried through a copper line having half the width of an aluminum line.

The electromigration characteristics of copper are also much superior to those of aluminum. Aluminum is approximately ten times more susceptible than copper to degradation and breakage through electromigration. As a result, a copper line, even one having a much smaller cross-section than an aluminum line, is better able to maintain electrical integrity.

There have been problems associated with the use of copper, however, in IC processing. Copper pollutes many of the materials used in IC processes and, therefore, care must be taken to keep copper from migrating. The migration of copper into silicon semiconductor regions is especially harmful. The conduction characteristics of the semiconductor regions are a consideration in the design of a transistors. Typically, the fabrication process is carefully controlled to produce semiconductor regions in accordance with the design. Elements of copper migrating into these semiconductor regions can dramatically alter the conduction characteristics of associated transistors.

Various means have been suggested to deal with the problem of copper diffusion into integrated circuit material. Several materials, especially metallic ones, have been suggested for use as barriers to prevent the copper diffusion process. Tungsten, molybdenum, and titanium nitride (TiN) have also been suggested for use as copper diffusion barriers. However, the adhesion of copper to these diffusion barrier materials has been an IC process problem, and the electrical conductivity of such materials is an issue in building IC interconnects.

Copper cannot be deposited onto substrates, or into vias, using conventional metal deposition processes, such as sputtering, when the geometries of the selected IC features are small. That is, new deposition processes have been developed for use with copper, instead of aluminum, in the lines and interconnects of an IC interlevel dielectric. It is impractical to sputter metal, either aluminum or copper, to fill small diameter vias, since the gap filling capability is poor. To deposit copper, a chemical vapor deposition (CVD) technique has been developed in the industry.

In a typical CVD process, copper is combined with a ligand, or organic compound, to make the copper volatile. That is, copper becomes an element in a compound that is vaporized into a gas. Selected surfaces of an integrated circuit, such as diffusion barrier material, are exposed to the copper gas in an elevated temperature environment. When the copper gas compound decomposes, copper is left behind on the selected surface. Several copper gas compounds are available for use with the CVD process. It is generally accepted that the configuration of the copper gas compound, at least partially, affects the ability the copper residue to adhere itself to the selected surface.

A co-pending application, Ser. No. 08/717,267, filed Sep. 20, 1996, entitled, "Oxidized Diffusion Barrier Surface for the Adherence of Copper and Method for Same", invented by Tue Nguyen, Lawrence J. Charneski, and Lynn R. Allen, Attorney Docket No. SMT 123, which is assigned to the same Assignees as the instant patent, discloses a method for oxidizing the diffusion barrier surface to improve the adherence of copper to a diffusion barrier. In low speed electrical circuits the resistance offered by a thin level of oxide is unnoticeable. However, in higher speed applications even a small amount of resistance can reduce the propagation time of electrons across an oxide layer. The primary purpose of this, above mentioned, patent application is to improve the ability of copper to remain deposited on a surface, not on improving the conductivity between copper and another surface.

Another co-pending application, Ser. No. 08/717,315, filed Sep. 20, 1996, entitled, "Copper Adhered to a Diffusion Barrier Surface and Method for Same", invented by Lawrence J. Charneski and Tue Nguyen, Attorney Docket No. SMT 243, which is assigned to the same Assignees as the instant patent, discloses a method for using a variety of reactive gas species to improve copper adhesion without forming an oxide layer over the diffusion barrier. However, the focus of this patent is to improve copper adhesion, not to improve the conductivity of copper deposited on a surface. In addition, the method of the above patent is generally only applicable to diffusion barrier material.

It would be advantageous to employ a method of improving the electrical conductivity of CVD copper with a conductive surface.

It would be advantageous if a method were employed for preparing a conductive surface, in advance of CVD copper deposition, to improve the conductivity between copper and the conductive surface.

Further, it would be advantageous if the conductivity improving process did not degrade the adhesion between the deposited copper and the conductive surface. It would also be advantageous if the process did not disrupt silicon bonds and structures in adjoining IC substrates.

Accordingly, a method of enhancing the interface conductivity of copper applied to selected integrated circuit surfaces is provided. The selected copper-receiving surfaces are predominantly conductive surfaces applied to selected regions of the IC. The method comprises the steps of: exposing each selected copper-receiving surface to a low energy source of ions; removing contaminants from each surface of the copper-receiving surface in response to the ion exposure; and applying CVD copper on each copper-receiving surface exposed above, whereby the ion exposure promotes electrical conductivity between the deposited copper and the copper-receiving surface.

Preferably, the source ions are generated from an inert gas, whereby chemical reactions between the ions and the copper-receiving surface are minimized. The inert gas is selected from the group consisting of Ar, He, Me, Kr, $H_2$, $N_2$, and Xe. In one preferred embodiment of the invention, the source ions have an energy level of generally less than 150 eV, whereby the low energy of the ions minimizes the penetration of ions into the exposed copper-receiving surface.

The copper-receiving surface is selected from the group consisting of Cu, Ti, W, and Al, whereby the cleaning of the copper-receiving surface promotes adhesion and conductivity between the copper-receiving surface and the deposited copper. Alternately, the copper-receiving surface is selected from the group consisting of TiN, TiON, TiSiN, TaSiN, TaN, TiW, TiWN, No, and WN, whereby copper is adhered to a copper-receiving surface which acts as a conductive diffusion barrier between the deposited copper and regions of the IC underlying the copper-receiving surface.

In an alternative embodiment of the invention, a metal alternative to copper is applied to selected integrated circuit surfaces, and the CVD metal alternative is selected from the group consisting of Al, W, and Ti.

An adherent copper conductor interface in an integrated circuit interlevel dielectric is also provided. The adherent copper conductor interface comprises a first surface of IC material including a semiconductor connection area having a connection area surface, and a second surface of IC material overlying the first surface. The copper interface also comprises a via, having vertical walls, between the second surface and the connection area. The copper conductor interface further comprises a diffusion barrier layer overlying the via walls and the connection area, with the surface of the diffusion barrier being exposed to a low energy source of ions from an inert gas to clean contaminants from the diffusion barrier surface. Finally, the copper interface comprises a copper stud adhered to the diffusion barrier surface to electrically interface the connection area to the second surface, whereby the ion exposure of the diffusion barrier surface promotes electrical conductivity between the conduction area and the second surface.

In one embodiment of the invention, the copper-receiving surface is exposed to ions of an inert gas and oxygen, and includes a further step of stopping the exposure of the copper-receiving surface to the ion exposure before an oxide layer is formed that exceeds approximately 30 angstroms (Å), whereby ions of the inert gas are used to clean the copper-receiving surface to improve electrical conductivity, and ions of the oxygen are used to form a thin oxide layer on the copper-receiving surface which improves adhesion of the copper-receiving surface to copper.

Another adherent copper conductor interface in an integrated circuit interlevel dielectric is also provided. The copper conductor interface comprises a first surface of IC material including a metallic connection area having a connection area surface, and a second surface of IC material overlying the first surface. The copper conductor interface comprises a via, having vertical walls, between the second surface and the conduction area surface. The copper conductor interface further comprises a diffusion barrier layer having a surface overlying the via walls. The diffusion barrier surface and the connection surface selected region are exposed to a low energy source of ions from the inert gas to clean contaminants from the diffusion barrier surface and the connection surface selected region. Finally, the copper conductor interface comprises a copper stud adhered to the diffusion barrier layer to electrically interface the connection area to the second surface, whereby the ion exposure of the diffusion barrier surface and the connection area selected region promotes electrical conductivity with copper.

BRIEF DESCRIPTION OF THE DRAWINGS

FIG. 1 is a flow chart illustrating the steps in the method of enhancing the interface conductivity of copper applied to selected IC surfaces.

FIG. 2 is a flow chart illustrating the steps in the method of enhancing the conductivity in a via for a copper electrical interconnect to the conductive connection area surface.

FIG. 3 is a flow chart illustrating another preferred method of enhancing the conductivity in a via for a copper electrical interconnect to the conductive connection area surface.

DETAILED DESCRIPTION OF THE PREFERRED EMBODIMENT

Figure 4:
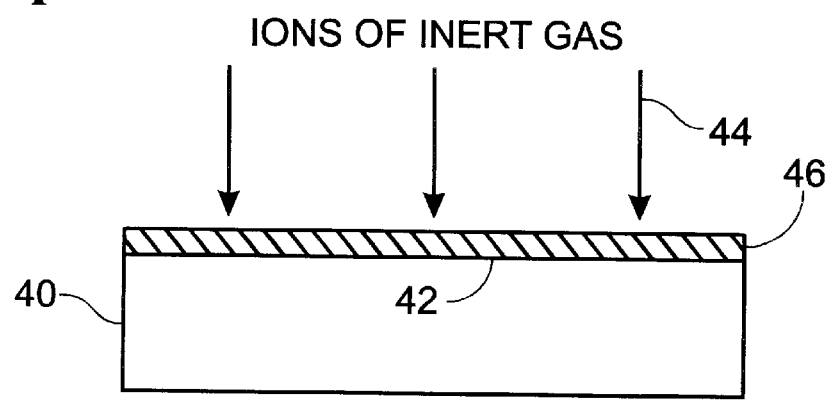
FIGS. 4 and 5 illustrate steps in the method of forming a completed adherent copper conductor interface on an integrated circuit.

FIG. 1 is a flow chart illustrating the steps in the method of enhancing the interface conductivity of copper applied to selected IC surfaces. Step 10 provides selected copper-receiving surfaces. These predominantly conductive surfaces are applied to selected regions of the IC. Step 12 exposes each selected copper-receiving surface to a low energy source of ions. Step 14 removes contaminants from each copper-receiving surface in response to the ion exposure in Step 12. Step 16 applies CVD copper on each copper-receiving surface exposed in Step 12. Step 18 is the product, an IC where the ion exposure in Step 12 promotes electrical conductivity between the deposited copper and the copper-receiving surface. In some processes, Steps 12 and 14 are combined so that they are the same step.

After several steps of IC processing, the copper-receiving surface has most likely been exposed to many sources of contamination. Simple exposure to an uncontrolled atmosphere may result in chemical compounds being formed between elements in the atmosphere and the conductive surface. The conductive surface has likely also been exposed to various etching and CMP processes which create and diffuse potential contaminants. In addition, the conductive surface is typically exposed to moisture particles, metals, and hydroxyls. The conductive surface has potentially absorbed both inert and chemical reactive gas species. Perhaps most detrimental of all, a conductive surface usually has a layer of polymers to inhibit electrical conductivity between the conductive surface and any subsequently deposited CVD copper.

Preferably, Step 12 includes generating the source ions from an inert gas, whereby chemical reactions between the ions and the copper-receiving surface are minimized. Since the ions are inert, there is less likelihood that these ions will combine with molecules of conductive surface material to form compounds on the surface which inhibit electrical conductivity. Rather than attempting to remove surface contaminants through a chemical reaction with the ions, the present method removes contaminants through the kinetic energy of the ions of an inert gas. It is a feature of the invention that the inert gas is selected from the group consisting of Ar, He, Ne, Kr, $H_2$, $N_2$, and Xe.

In one embodiment of the invention, Step 12 includes source ions having an energy level of generally less than 500 eV, whereby the low energy of the ions minimizes the penetration of ions into the exposed copper-receiving surface. In another embodiment of the invention Step 12 includes source ions having an energy level of generally less than 150 eV. Ion energy levels as low as 150 eV are atypical in IC processes. It is a novelty that the present invention is able to make use of such low energy levels to improve the conductivity of treated surfaces to subsequently deposited metal. While not intending to be bound by theory, it is believed that minimizing the penetration of the ions into the conductive surface lessens any detrimental effect the ions may have with regard to conductivity to a subsequently deposited copper layer. In addition, low energy ion bombardment minimizes potential damage to adjacent IC structures such as the crystalline bonds in semiconductor silicon. At energy levels of 150 eV, or less, the ions typically only penetrate the conductive surface to the level of 10 angstroms.

A trade-off must be made, in the IC fabrication process, between completing Step 14 quickly, and implanting ions in the conductive surface. High energy ions up to 500 eV will etch the conductive surface more quickly, but will also result in a deeper implantation of ions into the surface which made degrade the conductivity of the conductive surface. It is empirically determined, depending on the surface material and the required conductivity, the highest energy levels tolerable to effectively complete the step. Energy levels even higher than 500 eV are potentially practical.

A variety of sources may be used to generate the ions to expose the conductive surface in Step 12. It is a feature of the invention that Step 12 includes generating the source ions from a high density plasma source, having an ion density of greater than approximately 5 $mA/cm^2$. The high density plasma source is selected from the group consisting of electron cyclotron resonance (ECR), inductively coupled radio frequency (RF), transformer coupled plasma (TCP), and helicon plasma sources. In one embodiment of the invention, Step 12 includes generating the source ions from an ion source having a density of less than approximately 5 $mA/cm^2$. The low density source is selected from the group consisting of ion gun, RF sputter, and capacitively coupled substrate holder sources.

In one embodiment of the invention, the copper-receiving, or conductive, surface is selected from the group consisting of Cu, Ti, W, and Al, whereby the cleaning of the copper-receiving surface in Step 14 promotes adhesion and conductivity between the copper-receiving surface and the deposited copper. When copper is deposited on the above-mentioned copper-receiving surface material, electrical conductivity is always improved through exposure to ions in Step 12. In addition, with such metals as copper, ion exposure also improves adhesion to subsequently deposited copper layers.

In another embodiment of the invention, the copper-receiving surface is selected from the group consisting of TiN, TiON, TiSiN, TaSiN, TaN, TiW, TiWN, No, and WN, whereby copper is adhered to a copper-receiving surface which acts as a conductive diffusion barrier between the deposited copper and regions of the IC underlying the copper-receiving surface. As is well known in the art, copper must typically be encapsulated in diffusion barrier material to prevent the diffusion of copper into adjoining semiconductor regions. Oftentimes the diffusion barrier must be conductive to permit an electrical interface between a semiconductor area and the deposited copper. In these circumstances, it is often important to minimize resistance between the surface of the diffusion barrier material and the deposited copper. This is especially so when the propagation speed across the interface is critical to the circuit design. Electrical conductivity to a conductive diffusion barrier can be improved by preparing the surface with a low energy source of ions as in Step 12.

In one embodiment, Step 12 includes exposing the copper-receiving surface to source ions of an inert gas and oxygen. This method also includes the further step, following Step 14, of stopping the exposure of the copper-receiving surface in Step 12 before an oxide is formed in Step 14 that exceeds approximately 30 angstroms. That is, ions of the inert gas are used to clean the copper-receiving surface to improve electrical conductivity, and ions of the oxygen gas are used to form a thin oxide layer on the copper-receiving surface which improves the adhesion of the copper-receiving surface to copper. It has been determined that an oxide layer of approximately 30 Å, or less, has a minimal effect on the conductivity between surfaces while improving the adhesion between the copper-receiving surface and copper.

As used herein, the terms "oxide" and "oxygen-contained" refer to a layer of the conductive surface which contains at least some compounds formed with oxygen. For example, TiN combines with oxygen to form $TiO_XN_Y$. When enough oxygen is present, a perfect oxide is formed where X and Y equal 1. When less oxygen is available, TiN will combine with oxygen in less stable compounds where the numeric value of X is less than Y.

As mentioned earlier, it is the subject of co-pending patent application, Ser. No. 08/717,267, Attorney Docket No. SMT 123, that a thin layer of oxide formed on a conductive surface improves the adhesion of subsequently deposited copper to the oxidized surface. For many applications, any resistance introduced by the oxide layer between the conductive surface and the copper is negligible, so that propagation speed of electrons across the interface is not a factor. Alternately, in some circumstances, an increase in the adhesiveness between surfaces results in improved electrical conductivity. The gas mixtures and exposure times are varied to emphasize the characteristics of conductivity and adhesiveness.

In a similar embodiment, Step 12 includes generating the source ions from an inert gas, and includes the further steps, following Step 14, of exposing each copper-receiving surface to a reactive oxygen species, and oxidizing a thin layer of each copper-receiving surface in response to the oxygen exposure. The method includes the additional step of stopping the exposure of each copper-receiving surface before the oxide layer formed exceeds approximately 30 angstroms, whereby the copper-receiving surface is cleaned in Step 14 to improve electrical conductivity to the deposited copper, and the copper-receiving surface is oxidized to improve the adhesion to the deposited copper. That is, the copper-receiving surface is first exposed to an inert gas in Step 12 to perform the cleaning function in Step 14. At a subsequent step in the process, the copper-receiving surface is then exposed to an oxygen reactive species to oxidize a thin layer of a copper-receiving surface.

In some processes it is desirable to use a highly directional ion beam in Step 22. When ion beam directionality is important, Step 12 includes exposing the copper-receiving surface in a low pressure environment of less than approximately 10 mT, whereby the ion bombardment is an isotropic. As is well known in the art, the use of a low pressure environment minimizes the number of random ion collisions so that the ion beam remains highly directional. A highly directional ion beam may be used, for example, to etch a normal surface in the bottom of a via while minimizing the etching effect on the via's vertical walls that are parallel to the ion flow.

FIG. 2 is a flow chart illustrating the steps in the method of enhancing the conductivity in a via for a copper electrical interconnect to the conductive connection area surface. Step 20 provides an integrated circuit interlevel dielectric having a first surface including a conductive connection area with a connection area surface, a second surface overlying the first surface, and a via, having vertical walls, between the second surface and the connection area surface. Step 22 deposits diffusion barrier material in the via to form a diffusion barrier surface adjoining the walls of the via and overlying the connection area surface revealed by the via. Step 24 etches the diffusion barrier surface, overlying the connection area surface revealed by the via, to reveal the connection area surface. Step 26 exposes the connection area surface revealed in Step 24 to a low energy source of ions from an inert gas to clean contaminates from the conductive connection area surface. Step 28 is a product, an IC where the exposure of the connection area to ions improves the electrical conductivity of the surface to subsequently deposited copper.

A preferred embodiment of the invention includes the further step, following Step 26, of applying CVD copper in the via to electrically interface the connection area surface to the second surface, whereby copper is adhered to a material which prevents the diffusion of copper into regions of the IC material adjoining the via.

One embodiment of the invention includes the further step, following Step 22, of exposing the diffusion barrier surface adjoining the walls of the via to a reactive oxygen species to form a thin layer of oxygen-contained barrier material over the diffusion barrier surface, whereby the subsequently deposited copper stud better adheres to the via walls. That is, in one step, the diffusion barrier material on the via walls is prepared to adhere to a copper stud by exposure to an oxygen species. In another step, the connection surface at the bottom of the via is prepared with the ions of an inert gas to promote electrical conductivity to the copper stud. In this manner, the characteristic of both adhesion and conductivity are promoted.

In order to not remove the oxygen-contained barrier material, it is desirable that the via walls are not etched with inert gas ions in subsequent steps. This goal is obtained with the use of an anisotropic ion source. When a highly direction inert ion beam is desirable, Step 26 is performed in a low pressure environment of less than approximately 10 mT, whereby the ions anisotropically clean the connection area surface while removing a minimal amount of oxygen-contained barrier material from the via walls. The problem with using ions to isotropically clean the connection area in Step 26, is that the oxygen-contained barrier material on the via walls, prepared earlier with an oxygen species, is also likely to be stripped away. A low pressure environment helps insure that the connection area surface, normal to the inert gas ion beams, is the predominate surface cleaned in Step 26.

One method of removing diffusion barrier material includes using a an oxygen ion source. In Step 24 the diffusion barrier surface in the via overlying the connection area surface is etched with an oxygen ion source, whereby Step 24 is combined with the step of exposing the diffusion barrier surface adjoining the vias walls to a reactive oxygen species. Alternately, Step 24 includes using an inert gas ion source to etch the diffusion barrier surface in the via overlying the connection area surface. In this manner, Steps 24 and 26 are substantially combined. First, the diffusion barrier material overlying the connection area is etched away using an ion source. Second, the connection surface area is cleaned with the ion source. The etching Step of 24 and the cleaning Step 26 are performed at the same energy level. Alternately, the steps are performed at different energy levels.

FIG. 3 is a flow chart illustrating the steps of another method of enhancing the conductivity in via for a copper electrical interconnect to the conductive connection area surface. Step 30 provides an integrated circuit interlevel dielectric having a first surface including a semiconductor connection area with a connection area surface, a second surface overlying the first surface, and a via, having vertical walls, between the second surface and the connection area surface. Step 32 deposits diffusion barrier material in the via to form a diffusion barrier surface adjoining the walls of the via and overlying the connection area surface revealed by the via. Step 34 exposes the diffusion barrier surface in the via to a source of ions from an inert gas to clean contaminants from the diffusion barrier surface. Step 36 is a product, an IC where the electrical conductivity between the diffusion barrier surface and a subsequently deposited copper stud is improved.

A preferred embodiment includes the further step, following Step 34, of applying CVD copper in the via to electrically interface the connection area surface to the second surface, whereby the diffusion of copper into the semiconductor connection area is prevented by the diffusion barrier.

One embodiment of the invention includes the further step, following Step 34, of exposing the connection area surface revealed by the via to a reactive oxygen species to form a thin layer of oxygen-contained surface, whereby adhesion between the connection area surface and a subsequently deposited copper stud is improved. As mentioned earlier, the formation of an oxygen-contained layer over the connection area surface permits the designer to balance the considerations of copper adhesion against conductivity to the copper stud.

When ion implantation is to be minimized, Step 34 includes using a low energy ion source of less than approximately 150 eV, whereby cleaning with low energy ions promotes a smooth diffusion barrier surface, and minimizes the possibility of inadvertently removing portions of the diffusion barrier. Although a surface can be more quickly cleaned with a high energy ion source, using such a source makes for a rough surface. That is, the surface is removed in a non-uniform manner. A diffusion barrier is most effective when it minimizes resistance between conductive surfaces. Since the resistivity of the diffusion barrier material is typically greater than the interfacing metal interconnects, electrical conductivity is improved by minimizing the amount of diffusion barrier material in the interconnect. Therefore, it is desirable to make the diffusion barrier thin. Low energy levels allow the diffusion barrier to be thinned without producing holes in the barrier that permit copper migration. The use of a low energy ion source promotes a smooth surface which permits a thin, low resistance, diffusion barrier.

Figure 5:
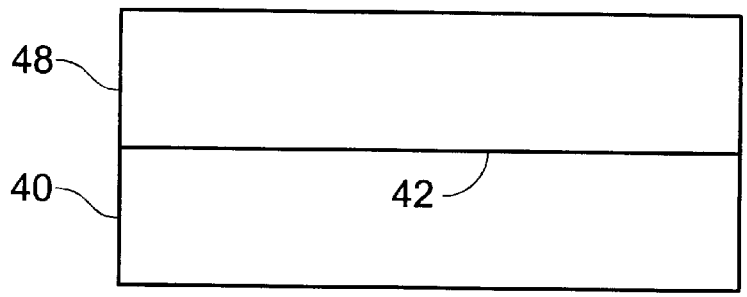

FIGS. 4 and 5 illustrate steps in the method of forming a completed adherent copper conductor interface on an integrated IC. FIG. 4 illustrates a surface of IC material including a conductive connection area with a connection area surface 42. Connection area surface 42 is exposed to a low energy source of ions represented by lines 44 from an inert gas to clean contaminants. The layer of contaminants removed by the ions is represented by a layer 46 overlying connection area surface 42.

FIG. 5 illustrates the IC of FIG. 4 with a copper layer 48 overlying conductive area surface 42, whereby the ion exposure of conductive connection area surface 42 permits highly conductive electrical communication between connection area surface 42 and copper layer 48.

Figure 6:
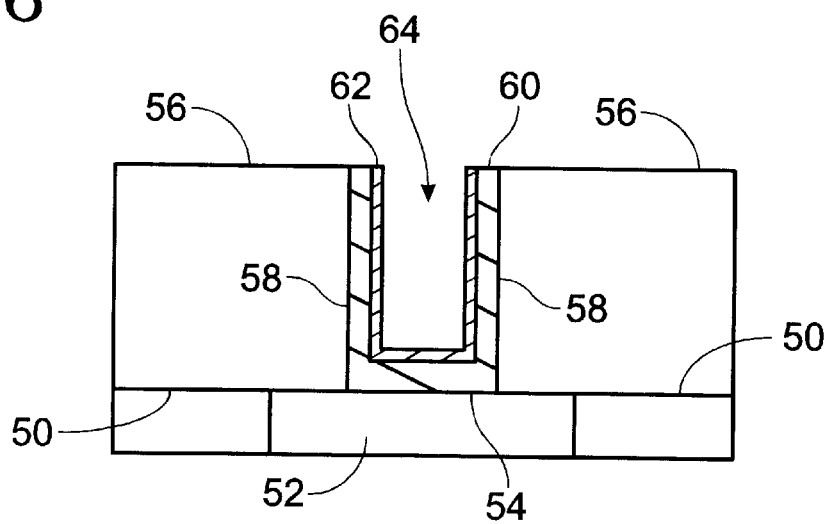
FIGS. 6 and 7 illustrate steps in the method of forming a completed copper conductor interface in an integrated circuit interlevel dielectric.
Figure 7:
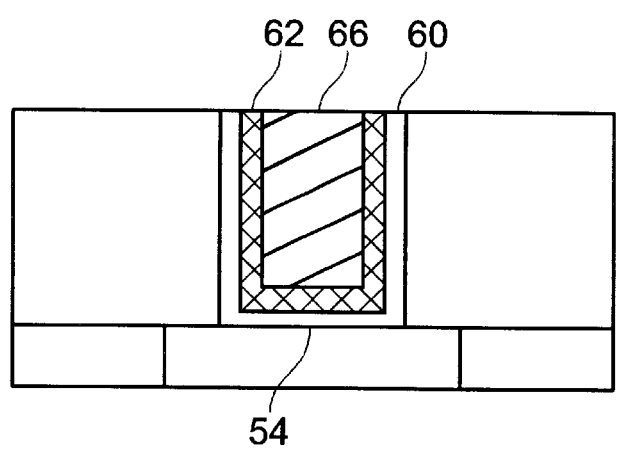

FIGS. 6 and 7 illustrate steps in the method of forming a completed adherent copper conductor interface in an integrated circuit interlevel dielectric. FIG. 6 illustrates an IC having a first surface 50 of IC material including a semiconductor connection area 52 having a connection area surface 54. The IC has a second surface 56 of IC material overlying first surface 50. A via, having vertical walls 58, is between second surface 56 and connection area surface 54. A diffusion barrier 60, represented in the figure by the area of hatched lines, having a surface 62, represented by the area of cross-hatching, overlies via wall 58 and connection area surface 54. Diffusion barrier surface 62 is exposed to a low energy source of ions from an inert gas to clean contaminants from diffusion barrier surface 62. The inert gas ions are represented by line 64.

FIG. 7 illustrates the IC of FIG. 6 with a copper stud 66 adhered to diffusion barrier surface 62 to electrically interface connection area 52 to second surface 56, whereby the ion exposure of diffusion barrier surface 62 promotes electrical conductivity between connection area 52 and second surface 56.

Figure 8:
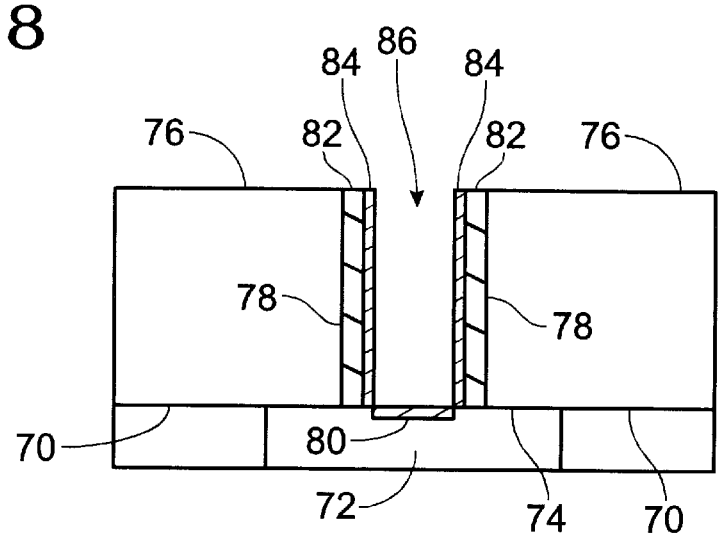
FIGS. 8 and 9 illustrate steps in an alternate method of forming a completed copper conductor interface in an integrated circuit interlevel dielectric.
Figure 9:
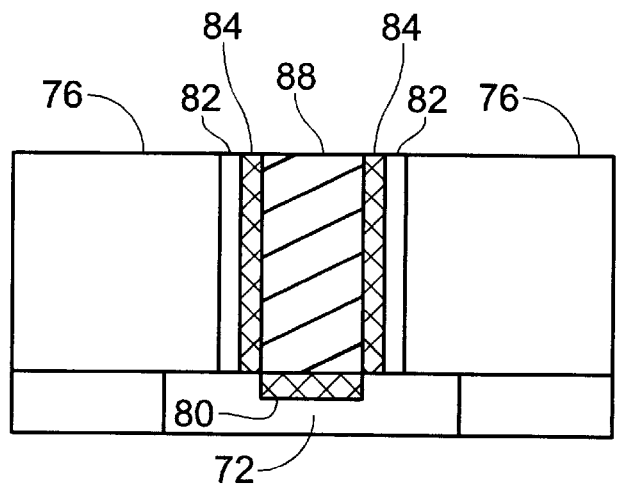

FIGS. 8 and 9 illustrate steps in an alternate method of forming a completed copper conductor interface in an integrated circuit interlevel dielectric. FIG. 8 illustrates an IC having a first surface 70 of IC material including a metallic connection area 72 having a connection area surface 74. A second surface 76 of IC material overlies first surface 70. The integrated circuit includes a via, having vertical walls 78, between second surface 76 and a selected region 80 of connection area 72. The IC further comprises a diffusion barrier 82, having a surface 84, overlying via walls 78. Diffusion barrier 82 is represented in the figure as the area with hatched lines, and diffusion barrier surface 84 is represented by the cross-hatched area. Diffusion barrier surface 84 and connection surface selected region 80 are exposed to a low energy source of ions from an inert gas to clean contaminants from diffusion barrier layer surface 84 and connection surface selected region 80. The inert gas ions are represented by line 86.

FIG. 9 illustrates the IC of FIG. 8 with a copper stud 88 adhered to diffusion barrier surface 84 to electrically interface connection area 72 to second surface 76, whereby the ion exposure of diffusion barrier surface 84 and connection area 72 promotes electrical conductivity with copper.

In an alternate embodiment of the invention, a metal alternative to copper is applied to selected IC surfaces, and Step 16 includes a CVD metal alternate selected from the group consisting of Al, W, and Ti. Typically, Al, W, and Ti are sputtered onto IC surfaces, and etched for removal from non-conductive surfaces. Following the removal of one of these metals from undesired surfaces, the surface is covered with an insulator such as $SiO_2$. Since these metals are not generally applied through CVD, the method of the present invention is often unnecessary. However, the method of the present invention is applicable to IC processes that potentially require a highly conductive interface formed from the application of CVD Al, W, and Ti.

In the course of preparing an IC conductive surface for CVD copper, a conductive surface is typically exposed to several IC processes such as etching, chemical mechanical polishing (CMP), and exposure to the air or other uncontrolled atmospheres. This exposure of the conductive surface results in contaminants such as moisture particles, absorbed gases, metals, hydroxyl groups, and polymers forming on, or combining with, the surface. Applying a low energy ion beam to the conductive surface etches the surface clean of contaminants without a deep penetration of the ions into the surface. A low energy ion cleaning with an inert gas allows the etching to be done with a minimum of chemical interaction between the ions, the conductive surface, and contaminants on the conductive surface. Using low energy helps insure that no damage is done to the crystalline structure of adjoining areas of silicon in the IC. In addition, since ion sources are common in the industry, the cleaning process can be done in-situ to minimize process delays. The conductive surface, after cleaning, is free of contaminants and substantially free of any ions of the inert gas used for the cleaning. When copper is deposited on the resulting surface, the conductivity between the copper and the conductive surface is maximized. In this manner, high speed electrical interfaces can be made.

The present invention and method are applicable to other IC interconnection structures, besides via studs, such as lines or copper filled trenches. The invention is also applicable to the more complicated dual damascene copper interconnect structures that are the subject of co-pending application, Ser. No. 08/665,014, filed Sep. 20, 1996, entitled, "Method for Transferring Multi-Level Photoresist Patterns", invented by The Nguyen, Sheng Teng Hsu, Jer-Shen Maa, Bruce Dale Ulrich, and Chien-Hsiung Peng, Docket No. SMT 162, which is assigned to the same Assignee as the instant patent, where copper interconnects are formed to multiple levels in an interlevel dielectric in one copper deposition step.

The removal of contaminants from the surfaces of metals and conductive diffusion barriers, with a low energy inert gas ion source, has been found to greatly enhance the electrical conductivity between these treated conductive surfaces and subsequently deposited layers of CVD copper. The present invention is of value in making electrical interfaces in high speed circuits. A novel and useful approach in forming a copper stud between dielectric interlevels has also been provided to enhance both conductivity and adhesiveness. The present invention can be implemented with a variety of ion sources so that the processes can be performed in-situ with a variety of common IC processing equipment. It allows improvements in the deposition of CVD copper with a minimum of process steps and delay time. The present invention is also applicable to copper interface structures such as interconnect lines and dual damascene structures. Other variations within the scope of the present invention occur to those skilled in the art.

What is claimed is:

1. A method of enhancing the interface conductivity of copper (Cu) applied to selected integrated circuit (IC) surfaces, the selected Cu-receiving surfaces being predominately conductive surfaces applied to selected regions of the IC, the method comprising the steps of:
   a) exposing each selected Cu-receiving surface to a low energy source of ions of an inert gas and oxygen;
   b) removing contaminants from each Cu-receiving surface in response to the inert gas ion exposure in step a);
   $b_1$) simultaneously with Step b), forming a thin layer of oxide on each Cu-receiving surface with the ions of oxygen;
   $b_2$) stopping the exposure of the Cu-receiving surface in step a) before an oxide layer is formed in step $b_1$) that exceeds approximately 30 Å, whereby ions of the inert gas are used to clean the Cu-receiving surface to improve electrical conductivity, and ions of the oxygen gas are used to form a thin oxide layer on the Cu-receiving surface which improves adhesion of the Cu-receiving surface to Cu; and
   c) applying CVD Cu on each Cu-receiving surface exposed in step a), whereby the ion exposure in step a) promotes electrical conductivity between the deposited Cu and the Cu-receiving surface.

2. A method as in claim 1 in which the inert gas is selected from the group consisting of Ar, He, Ne, Kr, $H_2$, $N_2$, and Xe.

3. A method as in claim 1 in which step a) includes source ions having an energy level of generally less than 500 eV, whereby the low energy of the ions minimizes the penetration of ions into the exposed Cu-receiving surface.

4. A method as in claim 1 in which step a) includes source ions having an energy level of generally less than 150 eV, whereby the low energy of the ions minimizes the penetration of ions into the exposed Cu-receiving surface.

5. A method as in claim 1 in which step a) includes generating the source ions from a high density plasma source, having an ion density of greater than approximately 5 $mA/cm^2$.

6. A method as in claim 5 in which the high density plasma source is selected from the group consisting of ECR, inductively coupled RF, TCP, and helicon plasma sources.

7. A method as in claim 1 in which step a) includes generating the source ions from an ion source having a density of less than approximately 5 $mA/cm^2$.

8. A method as in claim 7 in which the low density source is selected from the group consisting of ion gun, RF sputter, and capacitively coupled substrate holder sources.

9. A method as in claim 1 in which the Cu-receiving surface is selected from the group consisting of Cu, Ti, W, and Al, whereby the cleaning of the Cu-receiving surface in step b) promotes adhesion and conductivity between the Cu-receiving surface and the deposited Cu.

10. A method as in claim 1 in which the Cu-receiving surface is selected from the group consisting of TiN, TiON, TiSiN, TaSiN, TaN, TiW, TiWN, Mo, and WN, whereby Cu is adhered to a Cu-receiving surface which acts as a conductive diffusion barrier between the deposited Cu and regions of the IC underlying the Cu-receiving surface.

11. A method as in claim 1 in which step a) includes exposing the Cu-receiving surface in a low pressure environment of less than approximately 10 mT, whereby the ion bombardment is anisotropic.

12. A method of enhancing the interface conductivity of copper (Cu) applied to selected integrated circuit (IC) surfaces, the selected Cu-receiving surfaces being predominately conductive surfaces applied to selected regions of the IC, the method comprising the steps of:
   a) exposing each selected Cu-receiving surface to a low energy source of ions from an inert gas;
   b) removing contaminants from each Cu-receiving surface in response to the ion exposure in step a);
   c) exposing each Cu-receiving surface to a reactive oxygen species;
   d) oxidizing a thin layer of each Cu-receiving surface in response to the oxygen exposure in step c);
   e) stopping the exposure of each Cu-receiving surface in step c) before the oxide layer formed in step c) exceeds approximately 30 Å, whereby the Cu-receiving surface in cleaned in step b) to improve electrical conductivity to the deposited Cu, and the Cu-receiving surface is oxidized in step d) to improve the adhesion to the deposited Cu; and
   f) applying CVD Cu on each Cu-receiving surface exposed in step a), whereby the ion exposure in step a) promotes electrical conductivity between the deposited Cu and the Cu-receiving surface.

13. In an integrated circuit interlevel dielectric having a first surface including a conductive connection area with a connection area surface, a second surface overlying the first surface, and a via, having vertical walls between the second surface and the first surface connection area surface, a method of enhancing conductivity between a via interconnect, formed from the chemical vapor deposition (CVD) of copper, and the first surface connection area, the method comprising the steps of:
   a) depositing diffusion barrier material in the via to form a diffusion barrier surface adjoining the walls of the via and overlying the first surface connection area revealed by the via;
   b) etching the diffusion barrier surface overlying the first surface connection area, to reveal the first surface connection area surface;
   $b_1$) exposing the diffusion barrier surface adjoining the walls of the via to a reactive oxygen species to form a thin layer of oxygen-contained barrier material over the diffusion barrier surface, whereby the subsequently deposited Cu stud better adheres to the via walls:
   c) exposing the first surface connection area surface, revealed in step b), to a low energy anisotropic source of ions from an inert gas to clean contaminants from the first surface connection area, whereby the exposure of the conduction area to ions improves the electrical conductivity of the surface to subsequently deposited Cu; and
   d) applying CVD Cu in the via to form a highly conductive interconnect between the first surface connection area and the second surface.

14. A method as in claim 13 in which step c) is performed in a low pressure environment of less than approximately 10 mT, whereby the ions anisotropically clean the connection area surface while removing a minimal amount of oxygen-contained barrier material from the via walls.

15. A method as in claim 13 in which step b) includes using an oxygen ion source to etch the diffusion barrier surface in the via overlying the connection area surface, whereby steps b) and $b_1$) are substantially combined.

16. A method as in claim 13 in which step b) includes using an inert gas ion source to etch the diffusion barrier surface in the via overlying the connection area surface, whereby steps b) and c) are substantially combined.

17. In an integrated circuit interlevel dielectric having a first surface including a semiconductor connection area with a connection area surface, a second surface overlying the first surface, and a via, having vertical walls between the second surface and the connection area surface, a method of enhancing the conductivity between a via interconnect, formed from the chemical vapor deposition (CVD) of copper, to the first surface connection area, the method comprising the steps of:

a) depositing diffusion barrier material in the via to form a diffusion barrier surface adjoining the walls of the via and overlying the first surface connection area revealed by the via;

b) exposing the diffusion barrier surface in the via to a source of ions from an inert gas and oxygen;

$b_1$) cleaning contaminants from the diffusion barrier surface in response to the inert gas ion exposure in step b), whereby the electrical conductivity between the ion-exposed diffusion barrier surface and a subsequently deposited Cu stud is improved;

$b_2$) simultaneously with Step $b_1$), forming a thin layer of oxide on the diffusion barrier surface with the ions of oxygen; and $b_3$) stopping the exposure of the diffusion barrier surface in step a) before an oxide layer is formed in step $b_2$) that exceeds approximately 30 Å; and c) applying CVD Cu in the via so that the copper stud adheres to the diffusion barrier, electrically interfacing the first surface connection area to the second surface.

18. A method as in claim 17 in which the diffusion barrier material is selected from the group consisting of TiN, TiON, TiSiN, TaSiN, TaN, TiW, TiWN, Mo, and WN.

19. A method as in claim 17 in which step b) includes using a low energy ion source of less than approximately 150 eV, whereby cleaning with low energy ions promotes a smooth diffusion barrier surface and minimizes the possibility of inadvertently removing portions of the diffusion barrier surface.

20. A method of enhancing the interface conductivity of a metal selected from the group consisting of the metals Al, W, and Ti, applied to selected integrated circuit (IC) surfaces, the selected metal-receiving surfaces being predominately conductive surfaces applied to selected regions of the IC, the method comprising the steps of:

a) exposing each selected metal-receiving surface to a low energy source of ions of an inert gas and oxygen;

b) removing contaminants from each metal-receiving surface in response to the inert gas ion exposure in step a);

$b_1$) simultaneously with Step b), forming a thin layer of oxide on each metal-receiving surface with the ions of oxygen;

$b_2$) stopping the exposure of the metal-receiving surface in step a) before an oxide layer is formed in step $b_1$) that exceeds approximately 30 Å, whereby ions of the inert gas are used to clean the metal-receiving surface to improve electrical conductivity, and ions of the oxygen gas are used to form a thin oxide layer on the metal-receiving surface which improves adhesion of the metal-receiving surface to metal; and c) applying CVD metal on each metal-receiving surface exposed in step a), whereby the ion exposure in step a) promotes electrical conductivity between the deposited metal and the metal-receiving surface.

* * * * *